US012713826B2

(12) United States Patent
Park et al.

(10) Patent No.: US 12,713,826 B2
(45) Date of Patent: Aug. 18, 2026

(54) FLEXIBLE DISPLAY DEVICE

(71) Applicant: LG Display Co., Ltd., Seoul (KR)

(72) Inventors: JooHye Park, Anyang-si (KR); Keunyoung Kim, Seoul (KR); Hyesun Son, Seoul (KR); Minwan Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 449 days.

(21) Appl. No.: 18/514,793

(22) Filed: Nov. 20, 2023

(65) Prior Publication Data

US 2024/0224775 A1 Jul. 4, 2024

(30) Foreign Application Priority Data

Dec. 30, 2022 (KR) ........................ 10-2022-0190528

(51) Int. Cl.

*H10K 59/80* (2023.01)
*G06F 1/16* (2006.01)
*H10K 59/38* (2023.01)
*H10K 77/10* (2023.01)
*H10K 102/00* (2023.01)

(52) U.S. Cl.

CPC .......... *H10K 77/111* (2023.02); *G06F 1/1652* (2013.01); *H10K 59/38* (2023.02); *H10K 59/8722* (2023.02); *H10K 59/873* (2023.02); *H10K 59/8791* (2023.02); *H10K 2102/311* (2023.02)

(58) Field of Classification Search

CPC ........................... G02F 1/1652; H10K 59/873; H10K 59/8791; H10K 77/111
USPC .................................................. 313/498–512
See application file for complete search history.

(56) References Cited

U.S. PATENT DOCUMENTS

2024/0224774 A1* 7/2024 Park ..................... H10K 59/873
2024/0399867 A1* 12/2024 Layouni .................... B32B 7/08
2026/0036723 A1* 2/2026 Takachi ................... G02B 1/14
2026/0079533 A1* 3/2026 Jones .................... G06F 1/1652

FOREIGN PATENT DOCUMENTS

KR 10-2007-0013748 A 1/2007

* cited by examiner

*Primary Examiner* — Christopher M Raabe
(74) *Attorney, Agent, or Firm* — Birch, Stewart, Kolasch & Birch, LLP

(57) ABSTRACT

A flexible display device can include a flexible substrate including a display area in which a plurality of sub-pixels are disposed and a non-display area adjacent to the display area, an organic light emitting element disposed on the flexible substrate to correspond to each of the plurality of sub-pixels, an encapsulation layer on the organic light emitting element, a plurality of color filters disposed on the encapsulation layer to correspond to the plurality of sub-pixels, a black matrix disposed between the plurality of color filters, an adhesive layer disposed on the plurality of color filters and the black matrix, and a gray cover glass disposed on the adhesive layer. Further, the gray cover glass includes an intermediate layer and at least one chemically strengthened layer.

20 Claims, 8 Drawing Sheets

FLEXIBLE DISPLAY DEVICE

CROSS-REFERENCE TO RELATED APPLICATIONS

This application claims priority to Korean Patent Application No. 10-2022-0190528 filed on Dec. 30, 2022 in the Republic of Korea, the entire contents of which are hereby expressly incorporated by reference into the present application.

BACKGROUND

Technical Field

The present disclosure relates to a flexible display device, and more particularly, to a flexible display device having excellent foldability, low reflectance, and excellent ultraviolet (UV) reliability.

Discussion of the Background Art

An organic light emitting display device (OLED) does not need a separate light source, unlike a liquid crystal display device (LCD) having a backlight. Therefore, the organic light emitting display device can be manufactured to be light and thin, is advantageous in processing, and has an advantage of low power consumption due to low voltage driving. Above all, the organic light emitting display device includes a self-light emitting element and can have each layer formed of a thin organic thin film. Accordingly, it has excellent flexibility and elasticity compared to other display devices, and thus can be advantageously implemented as a flexible display device.

In general, the organic light emitting display device includes an anode, a cathode, and an organic light emitting layer disposed therebetween. As the cathode is formed using a metallic material having high reflectivity, external light is reflected by the metallic material, which can cause a limitation such as a decrease in reflective visibility or a contrast ratio.

Accordingly, a polarizing plate for absorbing external light can be disposed below a cover member to reduce reflection by external light. The polarizing plate is a film having a certain level of light transmittance and absorbs external light and its reflected light to thereby prevent a decrease in the contrast ratio.

As the interest in flexible and slim display devices has increased, a display device using a relatively thin coated polarizing film (instead of a thick polarizing plate) has been proposed. However, the coated polarizing film also has a large thickness, and if the thickness is reduced, a function and display quality of the polarizing film can be degraded.

Accordingly, it can be challenging to implement a flexible display device, which is subjected to a lot of stress during folding. In addition, the polarizing plate and the polarizing film also partially absorb light emitted from the organic light emitting layer, which can contribute to an issue of reducing light emitting efficiency.

SUMMARY OF THE DISCLOSURE

In order to solve or address these limitations, a color filter on encapsulation layer (CoE) structure has been proposed, instead of using a polarizing plate or a coated polarizing film. A general CoE structure is a structure in which a black matrix is disposed on an encapsulation layer to correspond to a non-emission area and a color filter is disposed to correspond to an emission area. This CoE structure can reduce a thickness of a display device and reduce power consumption without a decrease in light emitting efficiency. However, with the omission of the polarizing plate including a layer performing an ultraviolet (UV) blocking function, reliability with respect to ultraviolet light can be lowered and surface reflectance thereof can be increased compared to a display device having a polarizing plate.

Accordingly, an object to be achieved by the present disclosure is to provide a flexible display device having excellent foldability to allow for bending or folding thereof and having a lower reflectance compared to a display device including a polarizing plate.

Another object to be achieved by the present disclosure is to provide a flexible display device having excellent reliability with respect to ultraviolet light while having a low reflectance compared to a display device including a polarizing plate.

Still another object to be achieved by the present disclosure is to slim down a display device and easily implement the display device in various shapes such as a curved shape or a foldable shape.

Still another object to be achieved by the present disclosure is to provide a flexible display device in which a step due to a decorative pattern is removed so that a defect due to the step is solved.

Objects of the present disclosure are not limited to the above-mentioned objects, and other objects, which are not mentioned above, can be clearly understood by those skilled in the art from the following descriptions.

A flexible display device according to an exemplary embodiment of the present disclosure includes a flexible substrate including a display area in which a plurality of sub-pixels are disposed and a non-display area surrounding the display area: an organic light emitting element disposed on the flexible substrate to correspond to each of the plurality of sub-pixels: an encapsulation layer on the organic light emitting element: a plurality of color filters disposed on the encapsulation layer to correspond to the plurality of sub-pixels; a black matrix disposed between the plurality of color filters: an adhesive layer disposed on each of the plurality of color filters and the black matrix; and a gray cover glass disposed on the adhesive layer, wherein the gray cover glass includes an intermediate layer and at least one chemically strengthened layer, and the chemically strengthened layer has a potassium (K) content higher than that of the intermediate layer.

Other detailed matters of the exemplary embodiments are included in the detailed description and the drawings.

A flexible display device according to an aspect of the present disclosure uses a color filter and a black matrix instead of a polarizing plate and has a gray cover glass as a cover member so that reflectance is lowered while greatly improving reliability against ultraviolet light. Accordingly, the flexible display device according to the present disclosure has excellent display quality by absorbing external light and reflected light, and can minimize damage or deterioration of internal layers caused by ultraviolet light.

In addition, the flexible display device according to an aspect of the present disclosure includes a color filter and a black matrix instead of a thick polarizer, so an overall thickness of the display device can be reduced, and the display device can be easily implemented in various shapes such as a curved shape or a foldable shape.

In addition, the display device according to an aspect of the present disclosure can solve or address a defect or limitation due to a step by removing the step due to a decorative pattern.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
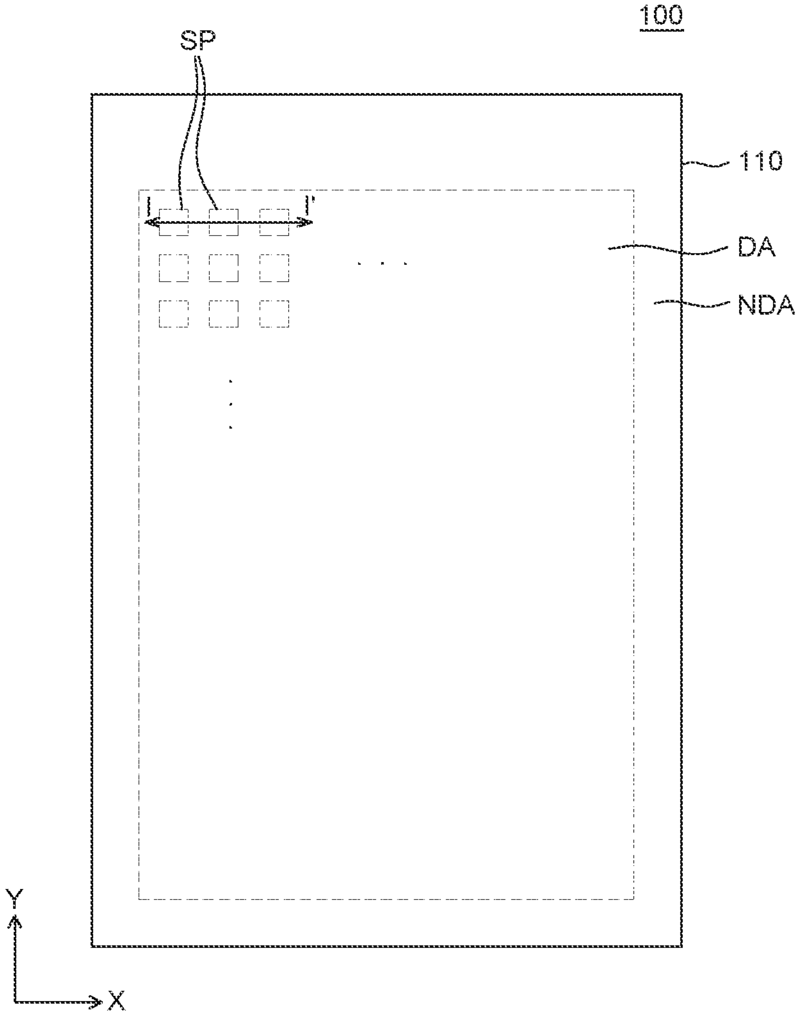
FIG. 1 is a schematic plan view of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "comprising," "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or layer or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the component illustrated.

The term "exemplary" is used to mean an example, and is interchangeably used with the term "example". Further, embodiments are example embodiments and aspects are example aspects. Any implementation described herein as an "example" is not necessarily to be construed as preferred or advantageous over other implementations.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings. All the components of each flexible display device according to all embodiments of the present disclosure are operatively coupled and configured.

Figure 2:
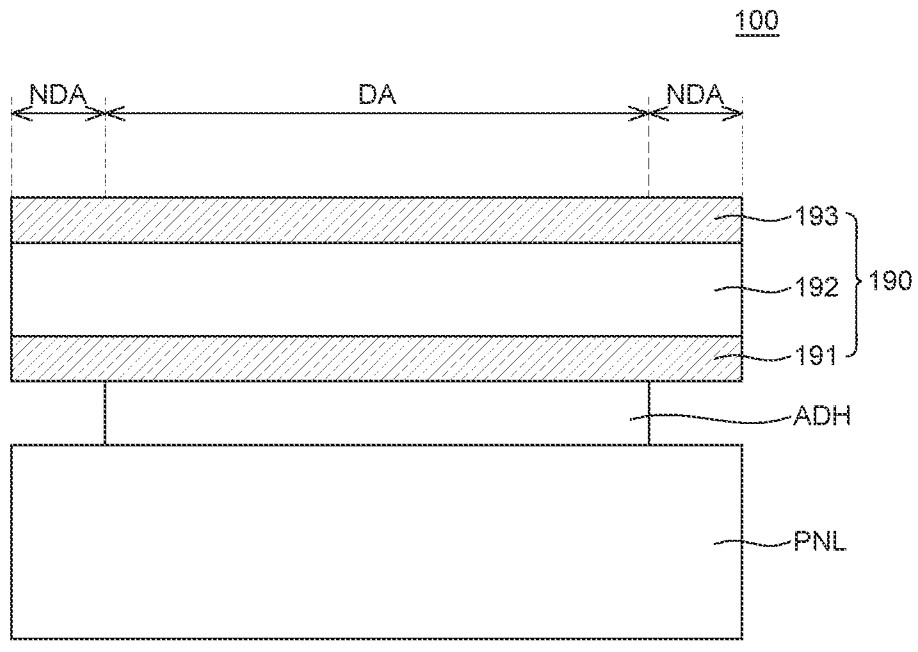
FIG. 2 is a schematic cross-sectional view of the flexible display device according to an exemplary embodiment of the present disclosure.
Figure 3:
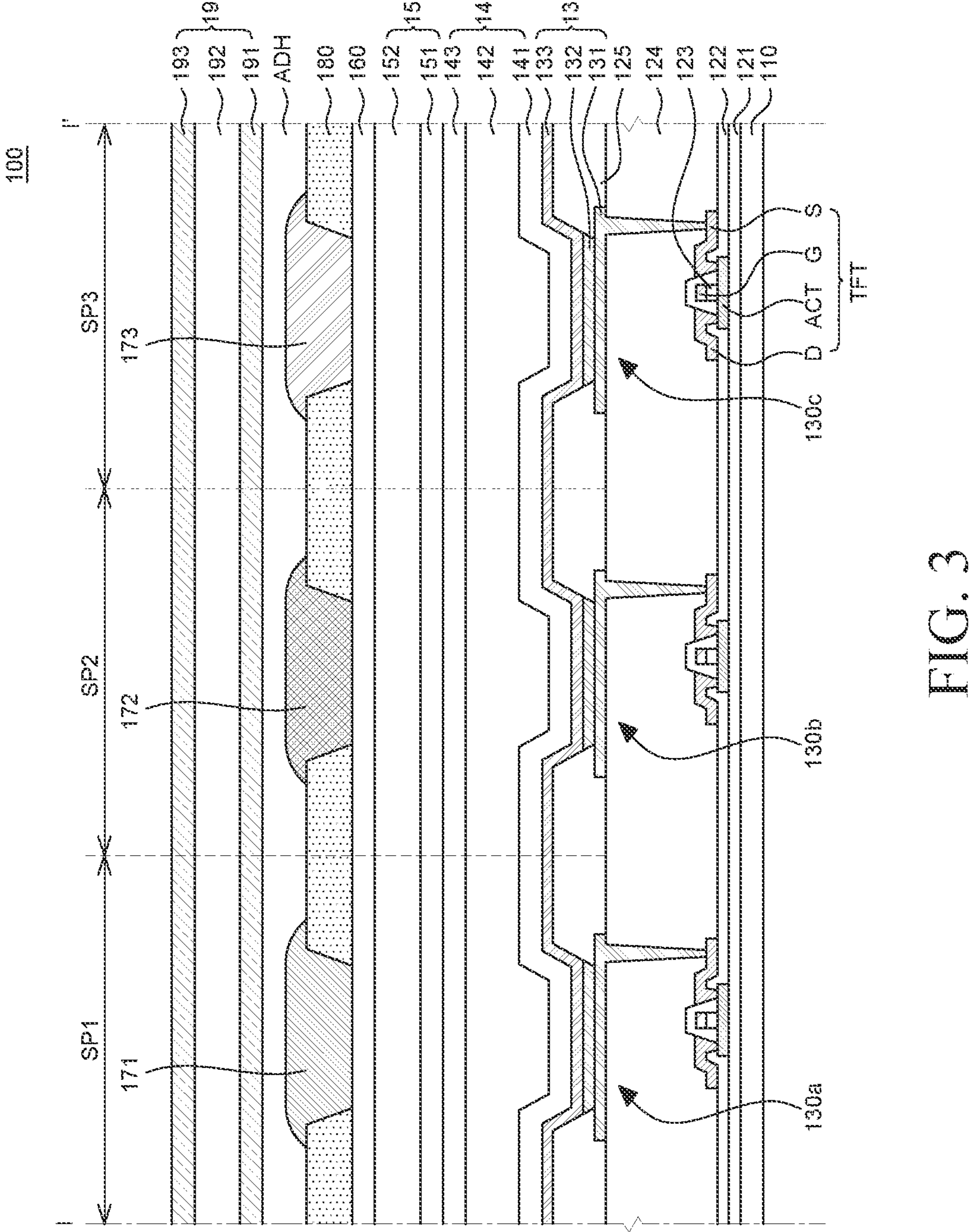
FIG. 3 is a cross-sectional view taken along line I-I' of FIG. 1.

FIG. 1 is a schematic plan view of a flexible display device according to an exemplary embodiment of the present disclosure. FIG. 2 is a schematic cross-sectional view of the flexible display device according to an exemplary embodiment of the present disclosure. FIG. 3 is a cross-sectional view taken along line I-I' of FIG. 1.

Referring to FIGS. 1 to 3, a flexible display device 100 according to an exemplary embodiment of the present disclosure includes an organic light emitting display panel PNL, an adhesive layer ADH, and a gray cover glass 190. The organic light emitting display panel PNL includes a substrate 110, organic light emitting elements 130, an encapsulation layer 140, a touch sensor unit 150, color filters 171, 172, and 173, and a black matrix 180.

The substrate 110 includes areas defined as a display area DA and a non-display area NDA. The display area DA is an area where a plurality of pixels are disposed to substantially display an image. The pixels including emission areas for displaying an image and driving circuits for driving the pixels can be disposed in the display area DA. The non-display area NDA surrounds the display area DA, e.g., the non-display area NDA can surround the display area DA completely or in part. The non-display area NDA is an area in which images are not substantially displayed, and various lines, driver integrated circuits (ICs), and printed circuit boards for driving the pixels and driving circuits disposed in the display area DA can be disposed in the non-display area NDA.

The plurality of pixels are arranged in a matrix configuration, but can be arranged differently, and each of the plurality of pixels includes a plurality of sub-pixels SP. The sub-pixel SP is an element for displaying one color and includes an emission area in which light is emitted and a non-emission area in which light is not emitted. For example, each of the plurality of sub-pixels can display any one color among red, green, and blue colors, but the present disclosure is not limited thereto.

For example, one pixel can include a first sub-pixel SP1, a second sub-pixel SP2, and a third sub-pixel SP3. The first sub-pixel SP1, the second sub-pixel SP2, and the third sub-pixel SP3 can display different colors, or some of the sub-pixels can display the same color as needed. For example, the first sub-pixel SP1 can be a red sub-pixel, the second sub-pixel SP2 can be a green sub-pixel, and the third sub-pixel SP3 can be a blue sub-pixel. However, the present disclosure is not limited thereto.

Although the sizes of the respective sub-pixels SP1, SP2, and SP3 are shown to be the same in the drawings, areas thereof can be formed differently according to colors displayed by the respective sub-pixels SP1, SP2, and SP3 in consideration of luminance and color temperature. Each of the sub-pixels SP1, SP2, and SP3 can have a circular shape, an elliptical shape, or a polygonal shape such as a triangular shape, a quadrangular shape, a pentagonal shape, or a hexagonal shape, but is not particularly limited.

The substrate 110 is a substrate for supporting various elements constituting the display device. For example, the substrate 110 can be a plastic substrate. For example, the plastic substrate can be selected from among polyimide, polyethersulfone, polyethylene terephthalate, and polycarbonate, but the present disclosure is not limited thereto. In the case of using a plastic substrate having flexibility, a support member such as a back plate can be disposed under the substrate 110. Since a plastic substrate having flexibility is relatively thin and less in rigidity compared to a glass substrate, sagging thereof can occur when various elements are disposed. The back plate supports the substrate 110 formed of plastic so that sagging of the substrate 110 does not occur, and protects the flexible display device 100 from moisture, heat, impacts, and the like. For example, the back plate can be formed of a metallic material such as stainless steel (SUS), or can be formed of a plastic material such as polymethylmethacry late, polycarbonate, polyvinyl alcohol, acrylonitrile-butadiene-styrene, or polyethylene terephthalate. When the back plate is disposed under the substrate 110, an adhesive member can be disposed between the substrate 110 and the back plate to bond them together. The adhesive member can be an optical transparent adhesive or a pressure sensitive adhesive, but the present disclosure is not limited thereto.

A substrate buffer layer 121 can be disposed on the substrate 110 to prevent penetration of oxygen or moisture. The substrate buffer layer 121 can be formed as a single layer or can be formed as a multilayer structure if necessary. A thin film transistor TFT including a gate electrode G, an active layer ACT, a source electrode S, and a drain electrode D is disposed on the substrate buffer layer 121. The thin film transistor TFT is disposed in each area of the first sub-pixel SP1, the second sub-pixel SP2, and the third sub-pixel SP3. In the drawings, only a driving thin film transistor among various thin film transistors that can be included in the flexible display device 100 is illustrated for convenience of description. Also, it is exemplarily illustrated that the thin film transistor TFT has a coplanar structure, but the present disclosure is not limited thereto, and a thin film transistor TFT having an inverted staggered structure can also be used.

For example, the active layer ACT is disposed on the substrate buffer layer 121, and a gate insulating layer 123 for insulating the active layer ACT and the gate electrode G is disposed on the active layer ACT. In addition, an interlayer insulating layer 122 is disposed on the substrate buffer layer 121 to insulate the gate electrode G, and the source electrode S and the drain electrode D. The source electrode S and the drain electrode D that are respectively in contact with the active layer ACT are formed on the interlayer insulating layer 122. A planarization layer 124 can be disposed on the thin film transistor TFT. The planarization layer 124 planarizes an upper portion of the thin film transistor TFT. The planarization layer 124 can include contact holes for electrically connecting the thin film transistors TFT and anodes 131 of the organic light emitting elements 130.

The organic light emitting elements 130 are disposed on the planarization layer 124. The organic light emitting elements 130 include a first organic light emitting element 130*a* disposed in the first sub-pixel SP1, a second organic light emitting element 130*b* disposed in the second sub-pixel SP2, and a third organic light emitting element 130*c* disposed in the third sub-pixel SP3. Each of the organic light emitting elements 130*a*, 130*b*, and 130*c* includes the anode 131, an organic light emitting layer 132, and a cathode 133.

The anode 131 is disposed on planarization layer 124. The anode 131 is disposed to correspond to each of the plurality of sub-pixels SP1, SP2, and SP3. The anode 131 is a component for supplying holes to the organic light emitting layer 132 and is formed of a conductive material having a high work function. The anode 131 can be a transparent conductive layer formed of transparent conductive oxide (TCO). For example, the anode 131 can be formed of at least one selected from among transparent conductive oxides such as indium-tin-oxide (ITO), indium-zinc-oxide (IZO), indium-tin-zinc-oxide (ITZO), tin oxide ($SnO_2$), zinc oxide (ZnO), indium-copper-oxide (ICO) and aluminum-doped ZnO (AZO), but the present disclosure is not limited thereto. When the flexible display device 100 is driven in a top emission method, the anode 131 can further include a reflective layer to reflect light emitted from the organic light emitting layer 132 toward the cathode 133. The anodes 131 can be formed separately for each of the first sub-pixel SP1, the second sub-pixel SP2, and the third sub-pixel SP3. Banks 125 are disposed on the anodes 131 and the planarization layer 124. The banks 125 are disposed to cover edges of the anodes 131 of the organic light emitting elements 130. For example, the banks 125 can cover the edges of the anodes 131 of the organic light emitting elements 130. For example, the banks 125 can partition the plurality of sub-pixels SP1, SP2, and SP3. The banks 125 can be formed of an insulating material to insulate the anodes 131 of the sub-pixels SP1, SP2, and SP3 adjacent to one another. In addition, the banks 125 can be configured as black banks having a high light absorption rate to prevent color mixing between the adjacent sub-pixels SP1, SP2, and SP3. For example, the banks 125 can be formed of polyimide resin, acrylic resin, or benzocyclobutene resin, but the present disclosure is not limited thereto.

The cathode 133 is disposed on the anode 131. The cathode 133 can be formed of a metallic material having a low work function to smoothly supply electrons to the organic light emitting layer 132. For example, the cathode 133 can be formed of a metallic material selected from among calcium (Ca), barium (Ba), aluminum (Al), silver (Ag), and alloys containing one or more of them, but the present disclosure is not limited thereto. The cathode 133 can be formed as one layer on the anode 131. For example, the cathode 133 can be formed as a single layer in the first sub-pixel SP1, the second sub-pixel SP2, and the third sub-pixel SP3. When the flexible display device 100 is driven in the top emission method, the cathode 133 can be formed to have a very thin thickness and can be substantially transparent.

The organic light emitting layer 132 is disposed between the anode 131 and the cathode 133. The organic light emitting layer 132 is a layer that emits light by combining electrons and holes. The organic light emitting layer of the first organic light emitting element 130*a* can be a red organic light emitting layer, the organic light emitting layer of the second organic light emitting element 130*b* can be a green organic light emitting layer, and the organic light emitting layer of the third organic light emitting element 130*c* can be a blue organic light emitting layer.

The organic light emitting element 130 can further include a hole injection layer, a hole transport layer, an electron transport layer, an electron injection layer, and the like to improve luminous efficiency. For example, a hole injection layer and a hole transport layer can be disposed between the anode 131 and the organic light emitting layer 132, and an electron transport layer and an electron injection layer can be disposed between the organic light emitting layer 132 and the cathode 133. In addition, a hole blocking layer or an electron blocking layer can be disposed in the organic light emitting layer 132 to further improve recombination efficiency of holes and electrons.

The encapsulation layer 140 is disposed on the organic light emitting element 130. The encapsulation layer 140 can cover the organic light emitting element 130. The encapsulation layer 140 can protect the organic light emitting element 130 from external moisture, oxygen, impacts, and the like. The encapsulation layer 140 can have a multilayer structure in which an inorganic layer formed of an inorganic insulating material and an organic layer formed of an organic material are stacked. For example, the encapsulation layer 140 can be configured to include at least one organic layer and at least two inorganic layers, and can have a multilayer structure in which the inorganic layer and the organic layer are alternately stacked, but the present disclosure is not limited thereto. For example, the encapsulation layer 140 can have a triple-layer structure including a first inorganic layer 141, an organic layer 142, and a second inorganic layer 143. In this case, each of the first inorganic layer 141 and the second inorganic layer 143 can be independently formed of at least one selected from silicon nitride (SiNx), silicon oxide (SiOx), aluminum oxide (AlOx), and silicon oxynitride (SiON), but the present disclosure is not limited thereto. In addition, the organic layer 142 can be formed of at least one selected from epoxy resin, polyimide, polyethylene, and silicon oxycarbide (SiOC), but the present disclosure is not limited thereto.

The touch sensor unit 150 can be disposed on the encapsulation layer 140 in order to provide a touch sensing function to the flexible display device 100. For example, the flexible display device 100 according to an exemplary embodiment of the present disclosure includes the touch sensor unit 150 having a structure in which a touch electrode layer 151 is formed on the encapsulation layer 140, which is not a structure in which a conventional touch panel having touch electrodes formed on a separate substrate is disposed on an upper portion of the organic light emitting element through an adhesive member. Since the touch sensor unit 150 is directly formed on the encapsulation layer 140, an adhesive member for bonding the touch sensor unit 150 and a display panel is omitted, so that a thickness of the flexible display device 100 can be reduced.

The touch sensor unit 150 includes the touch electrode layer 151 and a touch protection layer 152. If necessary or desired, a touch buffer layer can be selectively disposed on the second inorganic layer 143 and the touch electrode layer 151 can be disposed on the touch buffer layer. The touch buffer layer can be directly disposed on the second inorganic layer 143 to improve adhesion between the touch electrode layer 151 and the second inorganic layer 143. The touch buffer layer can be disposed on an entire surface of the substrate 110 throughout the display area DA and the non-display area NDA. Accordingly, when forming a plurality of touch electrodes, the touch buffer layer can protect the organic light emitting element 130 and signal lines or pads disposed in the non-display area NDA to drive the organic light emitting element 130 from being damaged. The touch buffer layer can be formed of an inorganic insulating material, for example, can be formed of at least one selected from silicon nitride (SiNx), silicon oxide (SiOx), aluminum oxide (AlOx), and silicon oxynitride (SiON), but the present disclosure is not limited thereto.

The touch electrode layer 151 is a layer including electrodes that sense a touch input, and can be configured to include a plurality of sensing electrodes and a plurality of driving electrodes, and can detect touch coordinates by detecting a change in capacitance between them. For example, the sensing electrodes and the driving electrodes can be disposed on the same plane, and at least some of the plurality of touch electrodes can be electrically connected through bridge electrodes disposed on a plane different from the touch electrodes with an insulating layer interposed therebetween. However, the present disclosure is not limited thereto, and a configuration of the touch sensor unit 150 can be variously changed as needed.

The touch electrode layer 151 can be formed of a transparent metallic material such as indium-tin-oxide (ITO) or indium-zinc-oxide (IZO) capable of transmitting light, but is not limited thereto. The touch protection layer 152 can be formed of an inorganic insulating material or an organic insulating material, and can have a multilayer structure in which a layer formed of an inorganic insulating material and a layer formed of an organic insulating material are alternately disposed.

For example, the touch protection layer 152 can be formed of at least one inorganic insulating material selected from among silicon nitride (SiNx), silicon oxide (SiOx), aluminum oxide (AlOx), and silicon oxynitride (SiON), or can be formed of a transparent organic insulating material such as acrylic resin, polyester-based resin, epoxy resin, or silicone-based resin. However, the present disclosure is not limited thereto.

A buffer layer 160 is disposed on the touch sensor unit 150. The buffer layer 160 is disposed on the touch protection layer 152. The buffer layer 160 protects the touch sensor unit 150 from being damaged during a process of forming the color filters 171, 172, and 173 and the black matrix 180 disposed on the touch sensor unit 150. In addition, the buffer layer 160 prevents penetration of moisture or oxygen from the outside to protect the touch sensor unit 150 from being damaged. The buffer layer 160 can be formed of an inorganic insulating material having excellent barrier properties. For example, the buffer layer 160 can be formed of at least one inorganic insulating material selected from silicon nitride (SiNx), silicon oxide (SiOx), aluminum oxide (AlOx), and silicon oxynitride (SiON), but is not limited thereto. In addition, the buffer layer 160 can compensate for a decrease in adhesive strength between a plurality of the color filters 171, 172, and 173 and the black matrix 180 and the touch sensor unit 150. For example, the buffer layer 160 is disposed on the touch sensor unit 150 so that the plurality of color filters 171, 172, and 173 and the black matrix 180 and the touch sensor unit 150 can be bonded to each other.

The plurality of color filters 171, 172, and 173 and the black matrix 180 are disposed on the buffer layer 160. The plurality of color filters 171, 172, and 173 and the black matrix 180 can serve as an anti-reflection layer that minimizes a decrease in visibility and a contrast ratio of the flexible display device 100 due to external light by absorbing the external light while maintaining high luminance of light emitted from the organic light emitting element 130.

The black matrix 180 is disposed on the buffer layer 160 to be positioned between the plurality of color filters 171, 172, and 173. The black matrix 180 partitions each of the plurality of color filters 171, 172, and 173. The black matrix 180 is disposed along boundaries of the sub-pixels SP1, SP2, and SP3 and includes openings corresponding to the sub-pixels SP1, SP2, and SP3. The black matrix 180 can be disposed to overlap the banks 125. Accordingly, color mixing between the sub-pixels SP1, SP2, and SP3 can be minimized. Also, the black matrix 180 absorbs external light. Accordingly, a decrease in visibility and contrast ratio of the flexible display device 100 due to external light can be minimized and addressed.

The black matrix 180 includes a base resin and a black material. The base resin can be at least one selected from among cardo-based resin, epoxy-based resin, acrylate-based resin, siloxane-based resin, and polyimide, but the present disclosure is not limited thereto. The black material can be a black pigment selected from among a carbon-based pigment, a metal oxide-based pigment, and an organic-based pigment. For example, the carbon-based pigment can be carbon black. For example, the metal oxide-based pigment can include titanium black (TiNxOy) and Cu-Mn-Fe-based black pigments, but the present disclosure is not limited thereto. For example, the organic-based pigment can be selected from among lactam black, perylene black, and aniline black, but the present disclosure is not limited thereto. In addition, an RGB black pigment including a red pigment, a blue pigment, and a green pigment can be used as the black material, but the present disclosure is not limited thereto.

The plurality of color filters 171, 172, and 173 are disposed on the buffer layer 160 to correspond to the sub-pixels disposed therebelow: The plurality of color filters 171, 172, and 173 are respectively disposed in the openings of the black matrix 180. The color filters 171, 172, and 173 can be disposed to fill the openings of the black matrix 180 and cover an upper surface of the black matrix 180.

Each of the color filters 171, 172, and 173 may not come into contact with each other at the boundaries of the sub-pixels and are independently disposed to correspond to each of the sub-pixels. Each of the color filters 171, 172, and 173 can correspond to a color of each of the sub-pixels corresponding thereto. For example, the plurality of color filters 171, 172, and 173 include a first color filter 171 corresponding to the first sub-pixel SP1, a second color filter 172 corresponding to the second sub-pixel SP2, and a third color filter 173 corresponding to the third sub-pixel SP3.

When the first sub-pixel SP1 is a red sub-pixel, the first color filter 171 is a red color filter. When the second sub-pixel SP2 is a green sub-pixel, the second color filter 172 is a green color filter. When the third sub-pixel SP3 is a blue sub-pixel, the third color filter 173 is a blue color filter. The first color filter 171 transmits red light. Here, a wavelength of the red light can be about 620 nm to about 750 nm, but the present disclosure is not limited thereto. The second color filter 172 transmits green light. Here, a wavelength of the green light can be about 495 nm to about 570 nm, but the present disclosure is not limited thereto. The third color filter 173 transmits blue light. Here, a wavelength of the blue light can be about 440 nm to about 495 nm, but the present disclosure is not limited thereto.

Each of the color filters 171, 172, and 173 can include a transparent base resin and a color-development material. For example, the transparent base resin can be one selected from polyacrylate, polymethyl methacrylate, polyimide, polyvinyl alcohol, polyethylene, polypropylene, polystyrene, polyethylene terephthalate, and the like, but the present disclosure is not limited thereto. The color-development material absorbs light in a specific wavelength band and transmits light in remaining wavelength bands. For example, the red color filter includes a red color-development material that transmits light in a red wavelength band and absorbs light in green and blue wavelength bands. For example, the red color-development material can be a phenylene-based compound or a diketo-pyrrolopyrrole-based compound. For example, the green color-development material can be a phthalocyanine-based compound. For example, the blue color-development material can be a copper phthalocyanine-based compound or an anthraquinone-based compound. However, the color-development material is not limited thereto, and any material that transmits light in red, blue, and green wavelength bands can be used without limitation.

Each of the plurality of color filters 171, 172, and 173 is arranged to correspond to the emission area of the sub-pixel SP1, SP2, or SP3 corresponding thereto. Accordingly, internal light emitted from each of the first sub-pixel SP1, the second sub-pixel SP2, and the third sub-pixel SP3 passes through the color filter 171, 172, or 173. For example, red light emitted from the first sub-pixel SP1 passes through the first color filter 171. On the other hand, when external light is incident, the external light corresponding to an absorption wavelength of the color-development material included in each of the color filters 171, 172, and 173 is absorbed by the color filter 171, 172, or 173. External light not absorbed by the color filter 171, 172, or 173 is reflected by the cathode 133 and passes through the color filter 171, 172, or 173 again. Reflected light corresponding to the absorption wavelength of the color-development material included in each of the color filters 171, 172, and 173 is absorbed by the color filter 171, 172, or 173. Accordingly, degradation of display quality due to the external light can be minimized and addressed.

The adhesive layer ADH is disposed to cover the plurality of color filters 171, 172, and 173 and the black matrix 180. The adhesive layer ADH bonds the gray cover glass 190 onto the plurality of color filters 171, 172, and 173 and the black matrix 180. Also, the adhesive layer ADH flattens upper surfaces of the plurality of color filters 171, 172, and 173 and the black matrix 180. For example, the adhesive layer ADH can be an optical transparent adhesive or a pressure-sensitive adhesive, but the present disclosure is not limited thereto. For example, a modulus of the adhesive layer ADH can be $10^3$ Pa to $10^8$ Pa or $10^4$ Pa to $10^7$ Pa, and folding characteristics are excellent within this range. The adhesive layer ADH can have a thickness of 5 μm to 30 μm. Within this range, a thickness of the flexible display device 100 can be kept slim, and folding characteristics of the flexible display device 100 can be excellent, while pressure during folding can be minimized.

A side surface of the adhesive layer ADH can be positioned more inwardly than a side surface of the gray cover glass 190 and a side surface of the display panel PNL disposed below the adhesive layer ADH. In this case, when manufacturing the flexible display device 100, defects or other issues which can be caused by residual adhesive or tearing of the adhesive layer ADH can be prevented.

The gray cover glass 190 is disposed on the plurality of color filters 171, 172, and 173 and the black matrix 180. The gray cover glass 190 is bonded to the plurality of color filters 171, 172, and 173 and the black matrix 180 by the adhesive layer ADH. Accordingly, the gray cover glass 190 is disposed on the adhesive layer ADH to be in contact therewith. The gray cover glass 190 contains a colorant and exhibits a dark and translucent gray color, unlike conventional transparent cover glass. Accordingly, the flexible display device 100 having a low reflectance, excellent luminous efficiency and improved display quality although it includes the plurality of color filters 171, 172, and 173 and the black matrix 180 instead of a polarizing plate can be provided.

The gray cover glass 190 can be formed by performing chemical strengthening treatment on a surface of a mother glass. Accordingly, the gray cover glass 190 includes a first chemically strengthened layer 191, an intermediate layer 192 and a second chemically strengthened layer 193. For example, the first chemically strengthened layer 191 is a region that is formed to a predetermined thickness in a thickness direction from a lower surface of the mother glass, the second chemically strengthened layer 193 is a region that is formed to a predetermined thickness in the thickness direction from an upper surface of the mother glass, and the intermediate layer 192 can be a region located between the first chemically strengthened layer 191 and the second chemically strengthened layer 193. Accordingly, the first chemically strengthened layer 191 contacts a lower portion of the intermediate layer 192, and the second chemically strengthened layer 193 contacts an upper portion of the intermediate layer 192. This will be described later.

The gray cover glass 190 is an alkali-alumino-silicate-based glass. For example, the gray cover glass 190 is manufactured from a mother glass containing alkali-alumino-silicate as a main component and containing a colorant, and the like. For example, the mother glass includes $SiO_2$, $Al_2O_3$, $Na_2O$, alkaline earth metal oxides, ultraviolet (UV) shielding agents and colorants.

Here, $SiO_2$ is a material used as a network former for forming a network structure of glass. For example, the network structure of glass can be formed with $SiO_2$ alone. Accordingly, if a content of $SiO_2$ is not sufficient, the network structure is unstable and crystallization is caused.

Further, $Na_2O$ is a network modifier, severing the network structure and occupying vacant sites within the network structure. Alkali metal oxides can be used as the network modifier. Among the alkali metal oxides, $Na_2O$ includes sodium ions having a small ionic radius, thereby facilitating a glass manufacturing process.

Furthermore, $Al_2O_3$ is a network intermediate and is a material for stabilizing the network structure and adjusting physical properties of glass such as a glass transition point and a thermal expansion coefficient.

In addition, $SiO_2$ takes 3-coordination to form a network structure of glass, but $Al_2O_3$ takes 4 coordination by combining with alkali metal oxides such as $Na_2O$. Thus, a density of the glass is improved and strength of the glass is enhanced. $Al_2O_3$ can serve to disrupt the network structure, and by using it, physical properties such as a glass transition point or a thermal expansion coefficient can be adjusted.

The alkaline earth metal oxide functions as a network intermediate, and facilitates a manufacture of glass by controlling properties of glass, such as a glass transition point or a thermal expansion coefficient. For example, the alkaline earth metal oxide can be at least one selected from CaO, MgO, and SrO.

The UV shielding agent forms an ultraviolet wavelength absorption band. Accordingly, the gray cover glass 190 can absorb ultraviolet light to minimize deterioration of lower layers caused by ultraviolet light, thereby improving reliability of the flexible display device against ultraviolet light. For example, the UV shielding agent can be at least one selected from $CeO_2$, $ZrO_2$ and $TiO_2$.

The colorant is a material that colors the cover glass to be gray. Accordingly, the gray cover glass absorbs external light and reflected light, and thus, reduces reflectance and improves reflective visibility. For example, the colorant can be at least two selected from among FeO, $Fe_2O_3$, $MnO_2$, $CoO_3$, $Mo_2O$, CuO and $Cr_2O_3$. When two or more of them are mixed, an absorption rate of external light or reflected light can be maximized without reducing luminous efficiency of red, green, and blue light.

For example, the mother glass can include 65 mol % to 70 mol % of $SiO_2$, 10 mol % to 15 mol % of $Al_2O_3$, 10 mol % to 15 mol % of $Na_2O$, 1 mol % to 5 mol % of the alkaline earth metal oxide, 0.1 mol % to 0.5 mol % of the UV shielding agent, and 0.01 mol % to 0.1 mol % of the colorant. Within this range, while a manufacture of the gray cover glass is facilitated, a strength of the cover glass is excellent, and the cover glass can be gray. The mother glass can be formed from a mother glass composition including the composition described above, and a ratio of each component is based on a total number of moles of materials constituting the mother glass composition.

As another example, the colorant can be included in an amount of 0.01 mol % to 0.05 mol %, and within this range, reflective visibility can be further improved by reducing reflectance while maintaining high luminous efficiency.

For example, a molar ratio of $Al_2O_3$ to $Na_2O$ in the mother glass can be 1:0.5 to 1:1.5 or 1:0.8 to 1:1.2. Within this range, the gray cover glass can be easily manufactured and can be applied to the flexible display device 100.

The mother glass composition can optionally further include additives to facilitate formation of a network structure or to adjust physical properties of the glass, if necessary. The additives can be used without particular limitation as long as they are generally used in the art.

The mother glass formed from the above-mentioned mother glass composition includes the UV shielding agent and the colorant and exhibits a gray color. If the mother glass is used as the cover glass, UV reliability can be improved while reducing the reflectance.

As described above, the gray cover glass 190 is formed by performing chemical strengthening treatment on the surface of the mother glass. For example, the chemical strengthening treatment can be carried out by immersing the mother glass in a solution containing $K_2O$ and then, performing heat treatment, or by applying the solution containing $K_2O$ to the surface of the mother glass in a non-immersion method and performing heat treatment. A step of performing the heat treatment includes a step of ion-exchanging $Na^+$ ions within the mother glass with $K^+$. As described above, the mother glass includes $Na_2O$, and $Na_+$ of $Na_2O$ is ion exchanged with $K^+$. Specifically, when immersing the mother glass in a solution containing $KNO_3$ and/or $K_2SO_4$as a main component, or applying $KNO_3$ and/or $K_2SO_4$ to the surface of the mother glass and then, performing heat treatment, $Na^+$ ions within the mother glass are diffused out and $K^+$ ions penetrate into sites where the $Na^+$ ions were present. If $K^+$, which has a larger ionic radius than that of $Na^+$, fills an empty space where $Na^+$ comes out, a compressive stress on the surface of the glass increases as more pressure is applied to the network structure. In this manner, a layer having a high compressive stress due to the ion exchange has excellent impact strength and compression characteristics. A heat treatment process can be performed at a high temperature enough to melt $KNO_3$ and/or $K_2SO_4$ so that ion exchange occurs between $K^+$ on the surface of the mother glass and $Na^+$ included in the mother glass. For example, the heat treatment can be performed for several tens of minutes at a temperature of 300° C. or higher or 300° C. to 400° C., but the present disclosure is not limited thereto.

The ion exchange as described above is performed within a range of a certain thickness from the surface of the mother glass because there is a limit for $K^+$ to penetrate into the mother glass. As a result, the surface of the mother glass has a composition different from an intermediate region of the mother glass. Accordingly, the gray cover glass of the present application formed by performing chemical strengthening treatment on the mother glass is divided into the first chemically strengthened layer 191, the intermediate layer 192, and the second chemically strengthened layer 193.

Since the intermediate layer 192 is a region in which ion exchange is not performed, it can have the same composition as that of the mother glass. For example, the intermediate layer 192 can include 65 mol % to 70 mol % of $SiO_2$, 10 mol % to 15 mol % of $Al_2O_3$, 10 mol % to 15 mol % of $Na_2O$, 1 mol % to 5 mol % of the alkaline earth metal oxide, 0.1 mol % to 0.5 mol % of the UV shielding agent, and 0.01 mol % to 0.1 mol % of the colorant. As another example, the colorant can be included in an amount of 0.01 mol % to 0.05 mol %. The ratio of each component is based on the total number of moles of materials constituting the intermediate layer 192. For example, the molar ratio of $Al_2O_3$ to $Na_2O$ in the middle layer 192 can be 1:0.5 to 1:1.5 or 1:0.8 to 1:1.2. Since the composition of the intermediate layer 192 is the same as the composition of the mother glass described above, redundant descriptions will be omitted or may be briefly provided.

Each of the first chemically strengthened layer 191 and the second chemically strengthened layer 193 is a region formed by ion-exchanging $Na^+$ of Na2O included in a region adjacent to the surface of the mother glass with $K^+$. Accordingly, it has a content of $Na_2O$ which is less than that of the intermediate layer 192 and can include K2O formed by the ion exchange. For example, each of the first chemically strengthened layer 191 and the second chemically strengthened layer 193 can include 65 mol % to 70 mol % of $SiO_2$, 10 mol % to 15 mol % of $Al_2O_3$, greater than 0 mol % and below 3 mol % of $Na_2O$, 7 mol % to 12 mol % of $K_2O$, 1 mol % to 5 mol % of the alkaline earth metal oxide, 0.1 mol % to 0.5 mol % of the UV shielding agent, and 0.01 mol % to 0.1 mol % of the colorant. The ratio of each component is based on the total number of moles of materials constituting the first chemically strengthened layer 191 or the second chemically strengthened layer 193. Within this range, a surface stress of the gray cover glass 190 is improved, thereby allowing for excellent strength. For example, the surface stress of each of the first chemically strengthened layer 191 and the second chemically strengthened layer 193 can be 400 MPa to 800 MPa. The gray cover glass 190 can be applied to the flexible display device 100 within this range, while having an advantage of excellent rigidity.

As described above, the ion exchange is performed within a range of a certain thickness from the surface of the mother glass because there is a limit for $K^+$ to penetrate into the mother glass. Accordingly, the first chemically strengthened layer 191 and the second chemically strengthened layer 193 are formed on a surface of the gray cover glass 190 to have a predetermined thickness. For example, a thickness of the gray cover glass 190 can be 70 μm to 200 μm, and a thickness of each of the first chemically strengthened layer 191 and the second chemically strengthened layer 193 can be 5 μm to 30 μm, 5 μm to 20 μm or 7 μm to 15 μm. Within this range, both flexibility and strength of the gray cover glass 190 can be satisfied.

For example, the gray cover glass 190 can have an average transmittance of 70% or more, 70% to 90%, or 80% to 90% in a wavelength range of 360 nm to 740 nm. Within this range, there is an effect of improving reflective visibility while having excellent luminous efficiency.

The gray cover glass 190 includes the UV shielding agent and has low transmittance in a UV wavelength band. Accordingly, UV reliability of the flexible display device 100 can be improved. For example, the gray cover glass 190 can have an average transmittance of 10% or less, 5% or less, 0.1% to 5%, or 0.1% to 3% in a wavelength range of 300 nm to 380 nm. UV light is effectively blocked within this range, so that lower layers of the gray cover glass 190 can be protected so that they are not deteriorated by the UV light.

Figure 4:
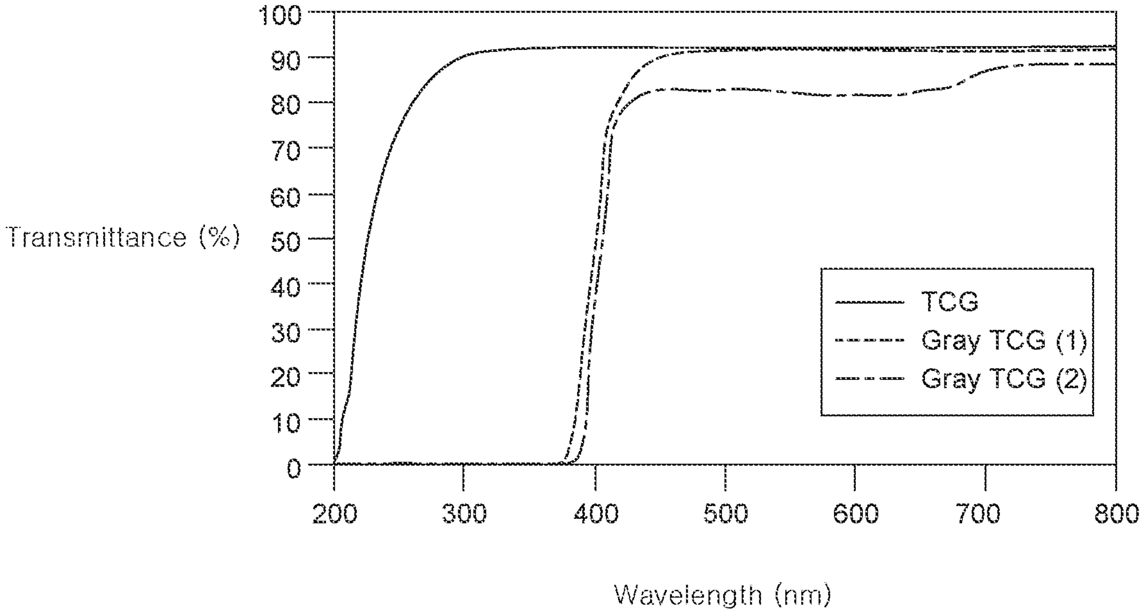
FIG. 4 is a graph showing transmittance for each wavelength of a gray cover glass and a transparent thin film cover glass.

This will be further described with reference to FIG. 4. FIG. 4 is a graph showing transmittance for each wavelength of a gray cover glass and a transparent thin film cover glass.

In FIG. 4, TCG is a transparent thin film cover glass widely used as a cover member in conventional flexible display devices, Gray TCG (1) is a thin film cover glass including a UV shielding agent, and Gray TCG (2) is a thin cover glass including a UV shielding agent and a colorant.

Referring to FIG. 4, it can be confirmed that the conventional transparent thin film cover glass TCG has a high transmittance of 90% or more in a wavelength range of 360 nm to 740 nm and also has a transmittance of 90% or more at a wavelength of 380 nm. Therefore, when a color filter and a black matrix having poor UV blocking properties were included instead of a polarizing plate, deterioration due to UV light can occur.

Unlike this, it can be confirmed that the thin film cover glass Gray TCG (1) including the UV shielding agent maintains high transmittance in a visible light wavelength band, but the transmittance is significantly reduced in a wavelength range of 300 nm to 380 nm. In addition, referring to the graph of the cover glass Gray TCG (2) including the UV shielding agent and the colorant, even if the colorant is further included therein, it can be confirmed that the transmittance in the visible light wavelength band is maintained as high as 70% or more, and wavelengths of 300 nm to 380 nm are hardly transmitted.

From this, it can be confirmed that the flexible display device 100 of the present disclosure includes the UV shielding agent and the colorant, so that the flexible display device 100 can effectively block UV light by effectively lowering the transmittance of the wavelength of 380 nm to 10% or less while maintaining the transmittance as high as 70% or more in a wavelength range of 360 nm to 740 nm.

The flexible display device 100 according to an exemplary embodiment of the present disclosure includes the plurality of color filters 171, 172, and 173 and the black matrix 180 instead of a polarizing plate, and includes the gray cover glass 190 as a cover member. The gray cover glass 190 includes the first chemically strengthened layer 191, the intermediate layer 192 and the second chemically strengthened layer 193. Accordingly, it is possible to provide the flexible display device 100 with excellent display quality by having excellent foldability and low reflectance. In addition, the gray cover glass 190 can include a UV blocking agent, so that UV reliability of the flexible display device 100 can be improved and layer deterioration caused by UV light can be minimized.

Figure 5:
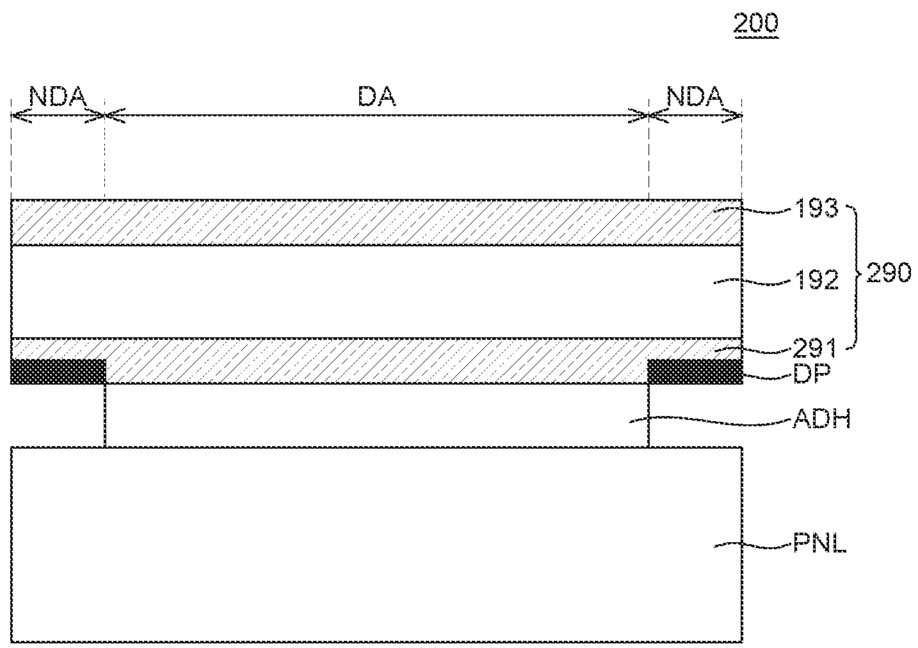
FIG. 5 is a schematic cross-sectional view of a flexible display device according to another exemplary embodiment of the present disclosure.
Figure 6:
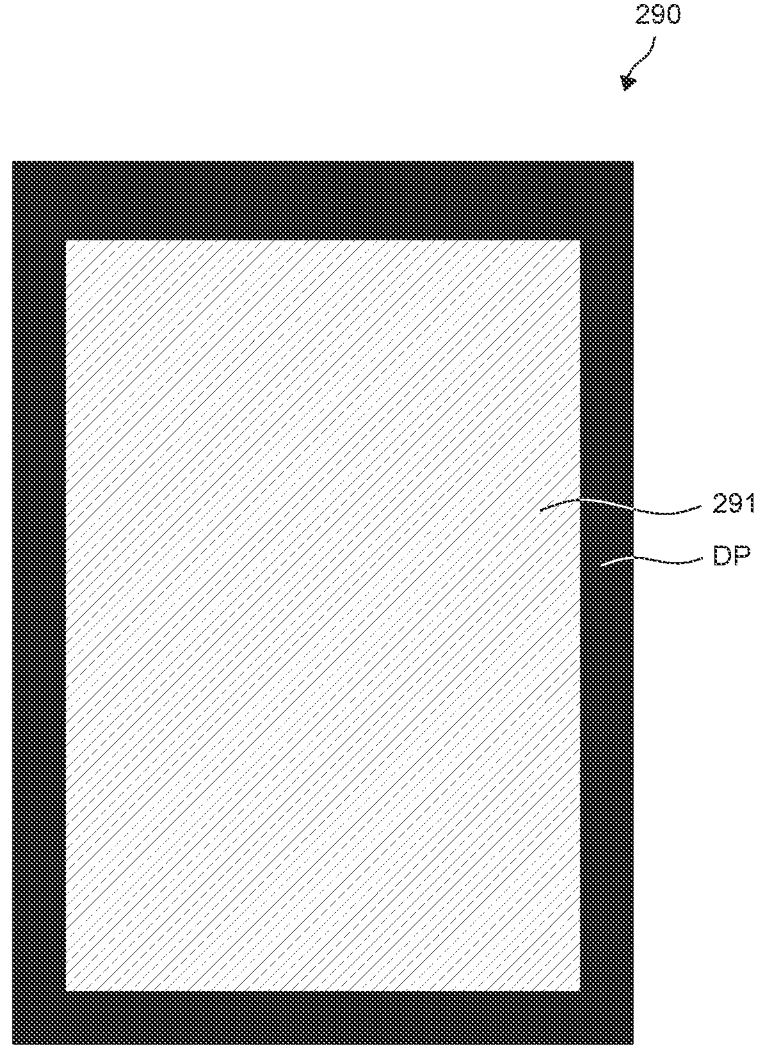
FIG. 6 is a plan view of a rear surface of a gray cover glass in a flexible display device according to another exemplary embodiment of the present disclosure.

FIG. 5 is a schematic cross-sectional view of a flexible display device according to another exemplary embodiment of the present disclosure. FIG. 6 is a plan view of a rear surface of a gray cover glass in the flexible display device according to another exemplary embodiment of the present disclosure. A flexible display device 200 shown in FIGS. 5 and 6 is substantially identical to the flexible display device 100 shown in FIGS. 1 to 3, with the exception that it further includes a decorative pattern in a first chemically strengthened layer. Accordingly, descriptions of redundant configurations will be omitted or will be briefly provided.

The flexible display device 200 according to another exemplary embodiment of the present disclosure includes a gray cover glass 290. The gray cover glass 290 includes a first chemically strengthened layer 291, an intermediate layer 192, and a second chemically strengthened layer 193. Since the intermediate layer 192 and the second chemically strengthened layer 193 are the same as those described above, descriptions thereof will be omitted or may be briefly provided.

The first chemically strengthened layer 291 includes a decorative pattern DP overlapping the non-display area NDA. The decorative pattern DP is disposed to overlap the non-display area NDA and has a quadrangular edge shape on a plane. However, the decorative pattern DP can overlap only a part of the non-display area NDA. Further, regardless of the shape of the non-display area NDA (e.g., which can have a shape different from the rectangular shape), the decorative pattern DP can overlap and correspond with the shape of the non-display area NDA.

The decorative pattern DP has a high light absorption characteristic, so that components such as lines disposed in the non-display area NDA are not visually recognized.

In addition, when a defect such as residual adhesive or tearing occurs on the side surface of the adhesive layer ADH, the decorative pattern DP can prevent such defect from being visually recognized from the outside. Accordingly, it is possible to minimize degradation in exterior characteristics due to residual adhesive. Also, the decorative pattern DP can prevent light leakage from the outside of the flexible display device 100.

The decorative pattern DP is located in the first chemically strengthened layer 291. A lower surface of the decorative pattern DP and a lower surface of the first chemically strengthened layer 291 form the same plane. The first chemically strengthened layer 291 contacts an upper surface and an inner side surface of the decorative pattern DP. For example, the decorative pattern DP is integrally formed with the first chemically strengthened layer 291 without a step.

In a conventional cover member including a decorative pattern, the decorative pattern is disposed on one surface of a cover glass, and an organic material such as an overcoating layer is applied to cover a step resulting therefrom, thereby allowing for flattening. Accordingly, there can be issues in that the thickness of the cover member can be large and air bubbles can be generated in the organic material due to the step(s).

However, since the decorative pattern DP is located in the first chemically strengthened layer 291 without a step in the gray cover glass 290 according to the aspects of the present disclosure, the issues associated with the step in the conventional cover member can be solved or effectively addressed. In addition, since a separate layer for covering the step is not required, the thickness of the cover member is small and flexibility thereof is excellent.

The decorative pattern DP can be formed on the first chemically strengthened layer 291 without a step by a non-immersion ion exchange method. Hereinafter, a method of manufacturing the gray cover glass 290 on which the decorative pattern DP is formed will be described with reference to FIG. 7.

Figure 7:
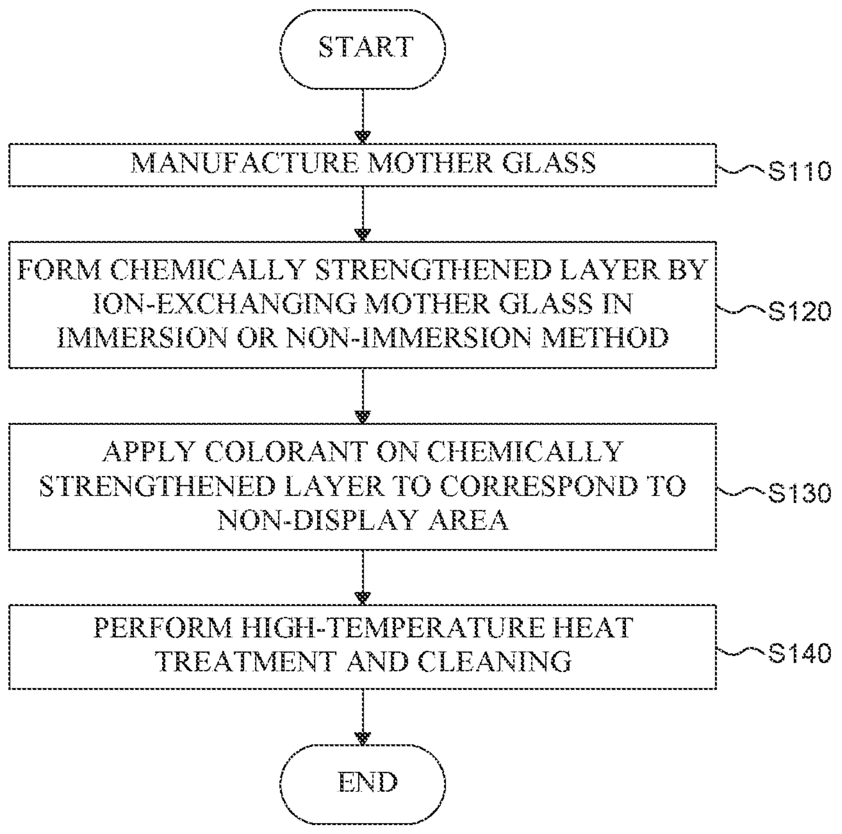
FIG. 7 is a process flow chart for explaining a method of manufacturing a gray cover glass having a decorative pattern formed thereon.

FIG. 7 is a process flow chart for explaining a method of manufacturing a gray cover glass having a decorative pattern formed thereon.

Referring to FIG. 7, the method of manufacturing the gray cover glass on which the decorative pattern is formed includes a step of manufacturing a mother glass in S110, a step of forming a chemically strengthened layer by ion-exchanging the mother glass in an immersion or non-immersion method in S120, a step of applying a colorant on the chemically strengthened layer to correspond to a non-display area in S130, and a step of performing high-temperature heat treatment and cleaning in S140. Among them, steps S110 and S120 have been described above, and redundant descriptions will be omitted or may be briefly provided.

Hereinafter, steps S130 and S140 of forming the decorative pattern DP in the non-immersion ion exchange method will be described in detail.

First, the colorant is applied to one surface of the gray cover glass which is chemically strengthened to correspond to the non-display area NDA. The colorant is prepared in a paste state and applied to the lower surface of the first chemically strengthened layer 291. As another example, the colorant can be applied to the lower surface of the first chemically strengthened layer 291 by a spray method. For example, the colorant can be a transition metal oxide. For example, the colorant can be selected from among FeO, $Fe_2O_3$, $MnO_2$, $CoO_3$, $Mo_2O$, CuO and $Cr_2O_3$.

Next, after performing heat treatment at high temperature, the colorant remaining on the surface is cleaned. For example, the heat treatment can be performed for several tens of minutes at a temperature of 300° C. or higher or 300° C. to 400° C., but the present disclosure is not limited thereto. A heat treatment step includes infiltrating transition metal ions from the surface of the gray cover glass coated with the colorant into an inside thereof. For example, a transition metal oxide is melted by high-temperature heat applied in the heat treatment step, and ion exchange is performed within the gray cover glass. The transition metal ions diffuse from the surface of the gray cover glass to the inside thereof due to a difference in ion concentration and penetrate into an empty space of a network structure. For example, a transition metal penetrates into the first chemically strengthened layer 291 to which the colorant is applied. Accordingly, the transition metal penetrates into the first chemically strengthened layer 291 corresponding to the non-display area NDA and is darkly colored to form a decorative pattern DP. Accordingly, the decorative pattern DP is formed in the first chemically strengthened layer 291 to correspond to the non-display area NDA without a step. Accordingly, a defect due to a step can be solved.

Since the decorative pattern DP is formed by infiltrating the colorant into a position of the first chemically strengthened layer 291 corresponding to the non-display area NDA, a content ratio of the colorant is higher than that of the first chemically strengthened layer 291. For example, the decorative pattern DP can include 65 mol % to 70 mol % of $SiO_2$, 10 mol % to 15 mol % of $Al_2O_3$, greater than 0 mol % and below 3 mol % of $Na_2O$, 7 mol % to 12 mol % of $K_2O$, 1 mol % to 5 mol % of the alkaline earth metal oxide, 0.1 mol % to 0.5 mol % of the UV shielding agent, and 0.5 mol % to 1.0 mol % of the colorant. Accordingly, it is possible to prevent lines or the like disposed in the non-display area NDA from being visually recognized from the outside, while maintaining high reliability.

The decorative pattern included in the conventional cover member is formed by coloring or coating using a polymer-based dye or the like. In this case, there can be defects/issues in which cracks or delamination can occur during folding due to the differences in physical properties such as a thermal expansion coefficient or rigidity between the cover glass and the decorative pattern.

In contrast, the decorative pattern DP of the present application has the same physical properties as the first chemically strengthened layer 291, such as a coefficient of thermal expansion and the like, but includes a relatively excessive amount of the colorant and thus exhibits a dark color. Accordingly, it is possible to solve or address the defects/issues which can be caused by the difference in physical properties described above.

In the case of forming the decorative pattern DP as described above, since there is a limit in penetration of the transition metal into the first chemically strengthened layer 291, it is performed within a range of a certain thickness from the surface of the first chemically strengthened layer 291. Accordingly, the decorative pattern DP is formed to have a predetermined thickness from the lower surface of the first chemically strengthened layer 291.

Depending on process conditions, the decorative pattern DP can have a thickness equal to or smaller than that of the first chemically strengthened layer 291. For example, the decorative pattern DP can have a thickness of 1 μm to 10 μm or 1 μm to 7 μm. When the thickness is 1 μm or less, the transmittance is high, and lines disposed in the non-display area NDA can be visually recognized from the outside. When the thickness is greater than that of the first chemically strengthened layer 291, a surface strength can be weakened and glass stability can be degraded. Accordingly, it is preferable to form the thickness of the decorative pattern DP to be smaller than the first chemically strengthened layer 291.

The flexible display device 200 is characterized in that the decorative pattern DP is formed in the first chemically strengthened layer 291 of the gray cover glass 290 without a step. Accordingly, it is possible to solve or address the defect/limitation which can be used by a step of a conventional decorative pattern. In addition, even if the decorative pattern DP is added, the thickness of the flexible display device 200 can be kept thin, thereby providing an advantage of further improving flexibility.

As noted above, FIG. 5 shows a structure in which the decorative pattern DP is disposed in the first chemically strengthened layer 291, but the present disclosure is not limited thereto. If necessary or desired, the decorative pattern DP can be disposed in a second chemically strengthened layer, and FIG. 8 shows an example of such configuration.

Figure 8:
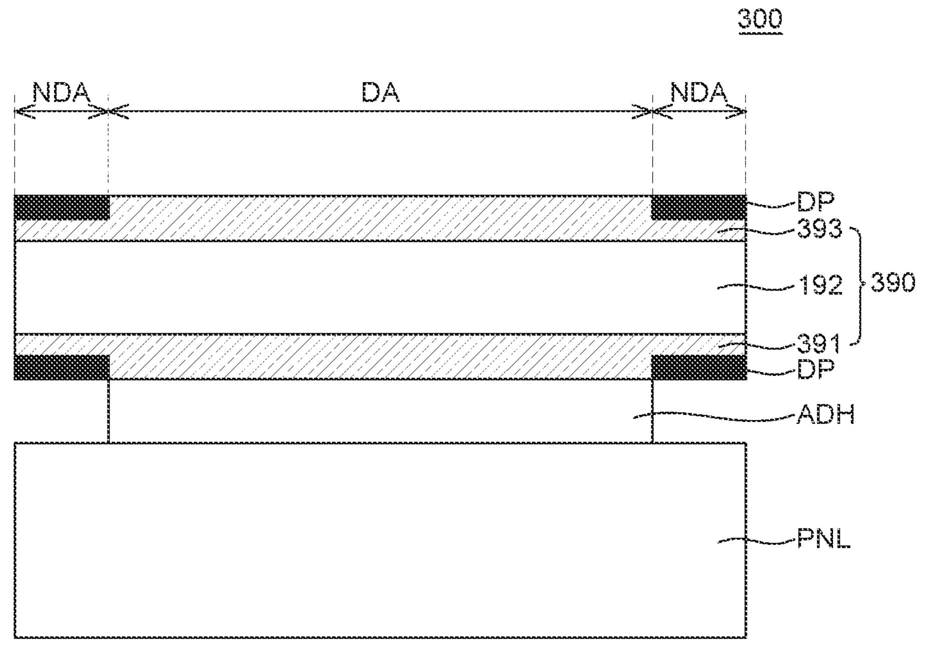
FIG. 8 is a schematic cross-sectional view of a flexible display device according to still another exemplary embodiment of the present disclosure.

Particularly, FIG. 8 is a schematic cross-sectional view of a flexible display device according to still another exemplary embodiment of the present disclosure. A flexible display device 300 shown in FIG. 8 is substantially identical to the flexible display device 200 shown in FIGS. 5 and 6 with the exception that a decorative pattern is further included in a second chemically strengthened layer. Accordingly, descriptions of redundant configurations will be omitted or may be briefly provided.

Referring to FIG. 8, the flexible display device 300 according to still another exemplary embodiment of the present disclosure includes a gray cover glass 390. The gray cover glass 390 includes a first chemically strengthened layer 391, the intermediate layer 192, and a second chemically strengthened layer 393. Each of the first chemically strengthened layer 391 and the second chemically strengthened layer 393 includes a decorative pattern DP overlapping the non-display area NDA. Since the intermediate layer 192 is identical to that described in FIGS. 1 to 3, and the first chemically strengthened layer 391 is identical to the first chemically strengthened layer 291 described in FIGS. 5 and 6, a redundant description thereof will be omitted or may be briefly provided.

The second chemically strengthened layer 393 includes the decorative pattern DP. The decorative pattern DP is disposed to overlap the non-display area NDA and has a quadrangular edge shape on a plane. An upper surface of the decorative pattern DP included in the second chemically strengthened layer 393 and an upper surface of the second chemically strengthened layer 393 form the same plane. The second chemically strengthened layer 393 contacts a lower surface and an inner side surface of the decorative pattern DP. For example, the decorative pattern DP is integrally formed with the second chemically strengthened layer 393 without a step.

In this manner, when the decorative pattern DP is formed on each of the first chemically strengthened layer 391 and the second chemically strengthened layer 393, it is possible to minimize a phenomenon in which components such as lines disposed in the non-display area NDA are visibly recognized, and a light leakage phenomenon can be further suppressed at an outer portion of the display device. In addition, in the gray cover glass 390, as the decorative pattern DP is located on each of the first chemically strengthened layer 391 and the second chemically strengthened layer 393 without a step, a defect due to the step that occurred in a conventional cover member can be solved or addressed. In addition, since a separate layer for covering the step is not needed, a small thickness is allowed and flexibility is excellent.

The decorative pattern DP included in the second chemically strengthened layer 393 is formed by the same non-immersion ion exchange method as described in FIG. 7. As described above, the non-immersion ion exchange method includes applying a transition metal oxide which is a colorant to a surface of the gray cover glass 390 and then performing heat treatment on the gray cover glass 390 to infiltrate transition metal ions from the surface of the gray cover glass 390 to an inside thereof. Accordingly, the decorative pattern DP is formed to have a certain thickness from the upper surface of the second chemically strengthened layer 393. Accordingly, the upper surface of the second chemically strengthened layer 393 and the decorative pattern DP form the same plane without a step.

Depending on process conditions, the decorative pattern DP can have a thickness equal to or smaller than that of the second chemically strengthened layer 393. For example, the thickness of the decorative pattern DP of the second chemically strengthened layer 393 can be 1 μm to 10 μm or 1 μm to 7 μm. When the thickness is 1 μm or less, transmittance is high, and lines disposed in the non-display area NDA can be visually recognized from the outside. If the thickness is greater than that of the second chemically strengthened layer 393, a surface strength can be weakened and glass stability can be degraded. Accordingly, it is preferable to form the thickness of the decorative pattern DP to be smaller than the second chemically strengthened layer 393.

A composition or other characteristics of the decorative pattern DP included in the second chemically strengthened layer 393 are the same or substantially the same as those of the first chemically strengthened layer 291 described in FIG. 5. Accordingly, redundant descriptions will be omitted.

The exemplary embodiments of the present disclosure can also be described as follows:

A flexible display device comprises a flexible substrate including a display area in which a plurality of sub-pixels are disposed and a non-display area surrounding the display area: an organic light emitting element disposed on the flexible substrate to correspond to each of the plurality of sub-pixels: an encapsulation layer on the organic light emitting element: a plurality of color filters disposed on the encapsulation layer to correspond to the plurality of sub-pixels: a black matrix disposed between the plurality of color filters: an adhesive layer disposed on each of the plurality of color filters and the black matrix: and a gray cover glass disposed on the adhesive layer, wherein the gray cover glass includes an intermediate layer and at least one chemically strengthened layer, and wherein the chemically strengthened layer has a potassium (K) content higher than that of the intermediate layer.

The gray cover glass can include the intermediate layer, a first chemically strengthened layer contacting a lower portion of the intermediate layer, and a second chemically strengthened layer contacting an upper portion of the intermediate layer.

At least one of the first chemically strengthened layer and the second chemically strengthened layer can further include a decorative pattern overlapping the non-display area.

The decorative pattern can be located in the first chemically strengthened layer and integrally formed with the first chemically strengthened layer, wherein a lower surface of the decorative pattern and a lower surface of the first chemically strengthened layer can form the same plane, and wherein the first chemically strengthened layer can contact an upper surface and an inner side surface of the decorative pattern.

The decorative pattern can be located in the second chemically strengthened layer and integrally formed with the second chemically strengthened layer, wherein an upper surface of the decorative pattern and an upper surface of the second chemically strengthened layer can form the same plane, and wherein the second chemically strengthened layer can contact a lower surface and an inner side surface of the decorative pattern.

The intermediate layer can include 65 mol % to 70 mol % of $SiO_2$, 10 mol % to 15 mol % of $Al_2O_3$, 10 mol % to 15 mol % of $Na_2O$, 1 mol % to 5 mol % of an alkaline earth metal oxide, 0.1 mol % to 0.5 mol % of a UV shielding agent, and 0.01 mol % to 0.1 mol % of a colorant.

The alkaline earth metal oxide can be at least one selected from CaO, MgO, and SrO. The UV shielding agent can be at least one selected from $CeO_2$, $ZrO_2$ and $TiO_2$.

The colorant can be at least two selected from among FeO, $Fe_2O_3$, $MnO_2$, $CoO_3$, $Mo_2O$, CuO and $Cr_2O_3$. A molar ratio of $Al_2O_3$ to $Na_2O$ can range from 1:0.5 to 1:1.5.

The first chemically strengthened layer and the second chemically strengthened layer can be chemically strengthened layers formed by ion-exchanging at least some of $Na^+$ ions included in a surface of the gray cover glass with $K^+$ ions.

Each of the first chemical strengthening layer and the second chemical strengthening layer can include 65 mol % to 70 mol % of $SiO_2$, 10 mol % to 15 mol % of $Al_2O_3$, greater than 0 mol % and below 3 mol % of $Na_2O$, 7 mol % to 12 mol % of $K_2O$, 1 mol % to 5 mol % of an alkaline earth metal oxide, 0.1 mol % to 0.5 mol % of a UV shielding agent, and 0.01 mol % to 0.1 mol % of a colorant.

The decorative pattern can include 65 mol % to 70 mol % of $SiO_2$, 10 mol % to 15 mol % of $Al_2O_3$, greater than 0 mol % and below 3 mol % of $Na_2O$, 7 mol % to 12 mol % of $K_2O$, 1 mol % to 5 mol % of an alkaline earth metal oxide, 0.1 mol % to 0.5 mol % of a UV shielding agent, and 0.5 mol % to 1.0 mol % of a colorant.

The gray cover glass can have a thickness of 70 μm to 200 μm, wherein each of the first chemically strengthened layer and the second chemically strengthened layer can have a thickness of 5 μm to 30 μm, wherein the decorative pattern can have a thickness of 1 μm to 10 μm, and wherein the thickness of the decorative pattern can be equal to or smaller than that of each of the first chemically strengthened layer and the second chemically strengthened layer.

The gray cover glass can have a transmittance of 70% or more in a wavelength range of 360 nm to 740 nm and a transmittance of 10% or less in a wavelength range of 300 nm to 380 nm.

Each of the first chemically strengthened layer and the second chemically strengthened layer can have a surface stress of 400 MPa to 800 MPa.

A flexible display device comprises a flexible substrate including a display area in which a plurality of sub-pixels are disposed and a non-display area surrounding the display area: an organic light emitting element disposed on the flexible substrate to correspond to each of the plurality of sub-pixels: an encapsulation layer on the organic light emitting element: a plurality of color filters disposed on the encapsulation layer to correspond to the plurality of sub-pixels: a black matrix disposed between the plurality of color filters; an adhesive layer disposed on each of the plurality of color filters and the black matrix; and a gray cover glass disposed on the adhesive layer, wherein the gray cover glass includes an intermediate layer, a first chemically strengthened layer and a second chemically strengthened layer, and wherein each of the first chemically strengthened layer and the second chemically strengthened layer further includes a decorative pattern overlapping the non-display area.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the claims as attached, and all the technical concepts in the equivalent scope thereof should be construed as falling within the scope of the present disclosure.

What is claimed is:

1. A flexible display device, comprising:
- a flexible substrate including a display area in which a plurality of sub-pixels are disposed and a non-display area adjacent to the display area;
- an organic light emitting element disposed on the flexible substrate to correspond to each of the plurality of sub-pixels;
- an encapsulation layer on the organic light emitting element;
- a plurality of color filters disposed on the encapsulation layer to correspond to the plurality of sub-pixels;
- a black matrix disposed between the plurality of color filters;
- an adhesive layer disposed on the plurality of color filters and the black matrix; and
- a gray cover glass disposed on the adhesive layer,
- wherein the gray cover glass includes an intermediate layer and at least one chemically strengthened layer, and
- wherein the at least one chemically strengthened layer has a potassium content level that is higher than a potassium content level of the intermediate layer.

2. The flexible display device of claim 1, wherein the at least one chemically strengthened layer of the gray cover glass includes:
- a first chemically strengthened layer contacting a lower portion of the intermediate layer, and
- a second chemically strengthened layer contacting an upper portion of the intermediate layer.

3. The flexible display device of claim 2, wherein at least one of the first chemically strengthened layer and the second chemically strengthened layer further includes a decorative pattern overlapping the non-display area.

4. The flexible display device of claim 3, wherein the decorative pattern is located in the first chemically strengthened layer and integrally formed with the first chemically strengthened layer,
- wherein a lower surface of the decorative pattern and a lower surface of the first chemically strengthened layer form a same plane, and
- wherein the first chemically strengthened layer contacts an upper surface and an inner side surface of the decorative pattern.

5. The flexible display device of claim 3, wherein the decorative pattern is located in the second chemically strengthened layer and integrally formed with the second chemically strengthened layer,
- wherein an upper surface of the decorative pattern and an upper surface of the second chemically strengthened layer form a same plane, and
- wherein the second chemically strengthened layer contacts a lower surface and an inner side surface of the decorative pattern.

6. The flexible display device of claim 3, wherein the intermediate layer includes:
- 65 mol % to 70 mol % of $SiO_2$,
- 10 mol % to 15 mol % of $Al_2O_3$,
- 10 mol % to 15 mol % of $Na_2O$,
- 1 mol % to 5 mol % of an alkaline earth metal oxide,
- 0.1 mol % to 0.5 mol % of an ultraviolet (UV) shielding agent, and
- 0.01 mol % to 0.1 mol % of a colorant.

7. The flexible display device of claim 6, wherein the alkaline earth metal oxide is at least one selected from CaO, MgO, and SrO.

8. The flexible display device of claim 6, wherein the UV shielding agent includes at least one selected from $CeO_2$, $ZrO_2$ and $TiO_2$.

9. The flexible display device of claim 6, wherein the colorant includes at least two selected from among FeO, $Fe_2O_3$, $MnO_2$, $CoO_3$, $Mo_2O$, CuO and $Cr_2O_3$.

10. The flexible display device of claim 6, wherein a molar ratio of $Al_2O_3$ to $Na_2O$ ranges from 1:0.5 to 1:1.5.

11. The flexible display device of claim 2, wherein the first chemically strengthened layer and the second chemically strengthened layer are chemically strengthened layers formed by ion-exchanging at least some of $Na^+$ ions included in a surface of the gray cover glass with $K^+$ ions.

12. The flexible display device of claim 11, wherein each of the first chemical strengthening layer and the second chemical strengthening layer includes:
- 65 mol % to 70 mol % of $SiO_2$,
- 10 mol % to 15 mol % of $Al_2O_3$,
- greater than 0 mol % and below 3 mol % of $Na_2O$,
- 7 mol % to 12 mol % of $K_2O$,
- 1 mol % to 5 mol % of an alkaline earth metal oxide,
- 0.1 mol % to 0.5 mol % of an ultraviolet (UV) shielding agent, and
- 0.01 mol % to 0.1 mol % of a colorant.

13. The flexible display device of claim 3, wherein the decorative pattern includes:
- 65 mol % to 70 mol % of $SiO_2$,
- 10 mol % to 15 mol % of $Al_2O_3$,l
- greater than 0 mol % and below 3 mol % of $Na_2O$,
- 7 mol % to 12 mol % of $K_2O$,
- 1 mol % to 5 mol % of an alkaline earth metal oxide,
- 0.1 mol % to 0.5 mol % of an ultraviolet (UV) shielding agent, and
- 0.5 mol % to 1.0 mol % of a colorant.

14. The flexible display device of claim 3, wherein the gray cover glass has a thickness of 70 μm to 200 μm,
- wherein each of the first chemically strengthened layer and the second chemically strengthened layer has a thickness of 5 μm to 30 μm,
- wherein the decorative pattern has a thickness of 1 μm to 10 μm, and
- wherein the thickness of the decorative pattern is equal to or smaller than the thickness of at least one of the first chemically strengthened layer and the second chemically strengthened layer.

15. The flexible display device of claim 1, wherein the gray cover glass has a transmittance equal to or greater than 70% in a wavelength range of 360 nm to 740 nm, and a transmittance equal to or less than 10% in a wavelength range of 300 nm to 380 nm.

16. The flexible display device of claim 2, wherein each of the first chemically strengthened layer and the second chemically strengthened layer has a surface stress of 400 MPa to 800 MPa.

17. A flexible display device, comprising:
- a flexible substrate including a display area having a plurality of sub-pixels and a non-display area adjacent to the display area;
- an organic light emitting element disposed on the flexible substrate to correspond to each of the plurality of sub-pixels;
- an encapsulation layer on the organic light emitting element;

a plurality of color filters disposed on the encapsulation layer to correspond to the plurality of sub-pixels;

a black matrix disposed between the plurality of color filters;

an adhesive layer disposed on the plurality of color filters and the black matrix; and a cover disposed on the adhesive layer, wherein the cover includes an intermediate layer, a first chemically strengthened layer and a second chemically strengthened layer, and wherein each of the first chemically strengthened layer and the second chemically strengthened layer further includes a decorative pattern overlapping the non-display area.

18. The flexible display device of claim 17, wherein the first chemically strengthened layer and the second chemically strengthened layer are chemically strengthened layers formed by ion-exchanging at least some of $Na^+$ ions included in a surface of the cover with $K^+$ ions.

19. The flexible display device of claim 17, wherein the decorative pattern includes:

65 mol % to 70 mol % of $SiO_2$, 10 mol % to 15 mol % of $AL_2O_3$, greater than 0 mol % and below 3 mol % of $Na_2O$, 7 mol % to 12 mol % of $K_2O$, 1 mol % to 5 mol % of an alkaline earth metal oxide, 0.1 mol % to 0.5 mol % of an ultraviolet (UV) shielding agent, and 0.5 mol % to 1.0 mol % of a colorant.

20. The flexible display device of claim 17, wherein the cover is a gray cover glass.

* * * * *